US005939872A

United States Patent [19]

Dubos et al.

[11] Patent Number: 5,939,872

[45] Date of Patent: *Aug. 17, 1999

[54] THERMAL OVERLOAD PROTECTION SYSTEM PROVIDING SUPPLY VOLTAGE REDUCTION IN DISCRETE STEPS AT PREDETERMINED TEMPERATURE THRESHOLDS

[75] Inventors: Laurent Dubos, Mesnil-Godefroy; Thierry Duval, St. Etienne du Rouvray, both of France

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/852,300

[22] Filed: May 7, 1997

[30] Foreign Application Priority Data

May 22, 1996 [FR] France .................................. 96 06358

[51] Int. Cl.[6] ...................................................... H03H 1/00

[52] U.S. Cl. .......................... 323/367; 219/501; 323/907; 323/316

[58] Field of Search .................................... 323/907, 367, 323/369, 245, 316; 219/497, 492, 501, 499

[56] References Cited

U.S. PATENT DOCUMENTS

| | | | |
|---|---|---|---|
| 3,789,190 | 1/1974 | Orosy et al. | 219/497 |
| 4,000,643 | 1/1977 | Pearson | 73/88.5 R |
| 4,042,875 | 8/1977 | Coulmance et al. | 323/245 |
| 4,184,634 | 1/1980 | Betts et al. | 236/13 |
| 4,523,429 | 6/1985 | Bingley | 60/203.1 |
| 4,546,238 | 10/1985 | Ahs | 219/497 |
| 5,075,537 | 12/1991 | Lorenzen et al. | 219/497 |

FOREIGN PATENT DOCUMENTS

| | | |
|---|---|---|
| A20104770 | 8/1983 | European Pat. Off. . |
| 4305038A1 | 8/1994 | Germany . |

*Primary Examiner*—Shawn Riley
*Attorney, Agent, or Firm*—Leroy Eason

[57] ABSTRACT

A power supply control system which prevents thermal overload of the apparatus to which power is being supplied. The supply voltage is controlled so that as the temperature of the apparatus increases beyond a predetermined threshold the supply voltage is reduced in incremental steps, thereby reducing thermal dissipation.

7 Claims, 3 Drawing Sheets

THERMAL OVERLOAD PROTECTION SYSTEM PROVIDING SUPPLY VOLTAGE REDUCTION IN DISCRETE STEPS AT PREDETERMINED TEMPERATURE THRESHOLDS

BACKGROUND OF THE INVENTION

1. Field of the Invention

The invention relates to a method of limiting the power dissipated by a unit comprising at least one electronic apparatus, provided with a power supply of a type supplying a voltage which is controllable by means of a control voltage.

The invention also relates to a unit comprising at least one electronic apparatus, provided with elements for limiting its own dissipated power, and a power supply which feeds said unit, said power supply being of a type supplying a voltage which is controllable by means of a control voltage.

Such a unit is, for example, a cable television distribution system.

2. Description of the Related Art

The document DE 43 05 038 discloses a MOSFET power transistor provided with elements for limiting its own dissipated power so as to avoid its destruction due to overheating. When the own temperature of the transistor becomes excessive, the power is limited by inserting a resistor in series in the control path of the power element.

SUMMARY OF THE INVENTION

It is an object of the invention to ensure completely safe operation of a unit as described, even if certain elements thereof are not protected against excessive temperatures.

To this end, the invention is characterized in that, on the basis of information supplied by a temperature gauge, a control voltage is generated in such a way that it maintains the power supply voltage constant as long as the temperature remains below a predetermined temperature threshold, and lowers the power supply voltage the more as the temperature rises beyond said threshold.

The invention is thus based on the idea of reducing the general power supply voltage rather than limiting the power dissipated by a particular component whose power supply voltage remains unchanged. In the case of, for example, a cable television distribution system, a progressive degradation of the linearity of the supplied signals, instead of a sudden cut-off or even a destruction of the material, is the result when the temperature is too high. Moreover, it is important to avoid a one-step sudden drop of the voltage beyond the temperature threshold, which would aggravate the detrimental effect of "pumping" which is likely to be produced because the temperature decreases once the power is reduced, so that the power supply does not return to its normal value and hence leads to heating again, and so forth.

Therefore, in accordance with one form of the method, at least two temperature thresholds are considered, each threshold corresponding to a different amount of reduction of the power supply voltage.

In accordance with another form of the method, successive power supply voltage variations are generated in the rhythm of a clock, which variations extend in the one or the other direction, dependent on whether the temperature threshold is exceeded or not exceeded.

A unit according to the invention comprises a circuit for generating the control voltage for the power supply, provided with a temperature gauge, which circuit generates a control voltage in such a way that it maintains the power supply voltage constant as long as the temperature remains below a predetermined temperature threshold, and lowers the power supply voltage the more as the temperature rises beyond said threshold.

In one embodiment, the circuit for generating a control voltage has at least two temperature thresholds each corresponding to a different amount of reduction of the power supply voltage.

A stepwise reduction of the power is thus simply obtained while avoiding instability of the power supply voltage.

Advantageously, the circuit for generating a control voltage comprises two differential amplifiers each being triggered by one of the temperature thresholds, and a bridge constituted by resistors, one of which is dependent on the temperature, which bridge has two branches fed by a reference voltage, one of the branches being provided with at least three resistors for obtaining two common points between the resistors of this branch, the bridge also having two crossbranches each connected to the respective inputs of one of the two differential amplifiers.

Two different temperature thresholds can thus be obtained with a single temperature-dependent resistor.

In another embodiment, the circuit for generating a control voltage comprises a differential amplifier and a bridge constituted by resistors, one of which is dependent on the temperature, which bridge has a crossbranch which is fed by a reference voltage, and another crossbranch to which the inputs of the differential amplifier are connected, which differential amplifier is triggered by a temperature threshold and whose output is connected to a digital circuit generating power supply voltage variations in one or the other direction, dependent on the state of the differential amplifier, in successive steps in the rhythm of a clock.

This is another way of obtaining a stepwise reduction of the power while avoiding instability of the power supply voltage.

Advantageously, in an apparatus incorporated in at least a housing, the temperature gauge is arranged within said housing.

In an advantageous embodiment, the power supply is a switched-mode power supply.

These and other aspects of the invention are apparent from and will be elucidated with reference to the embodiments described hereinafter.

DESCRIPTION OF THE PREFERRED EMBODIMENTS

Figure 1:
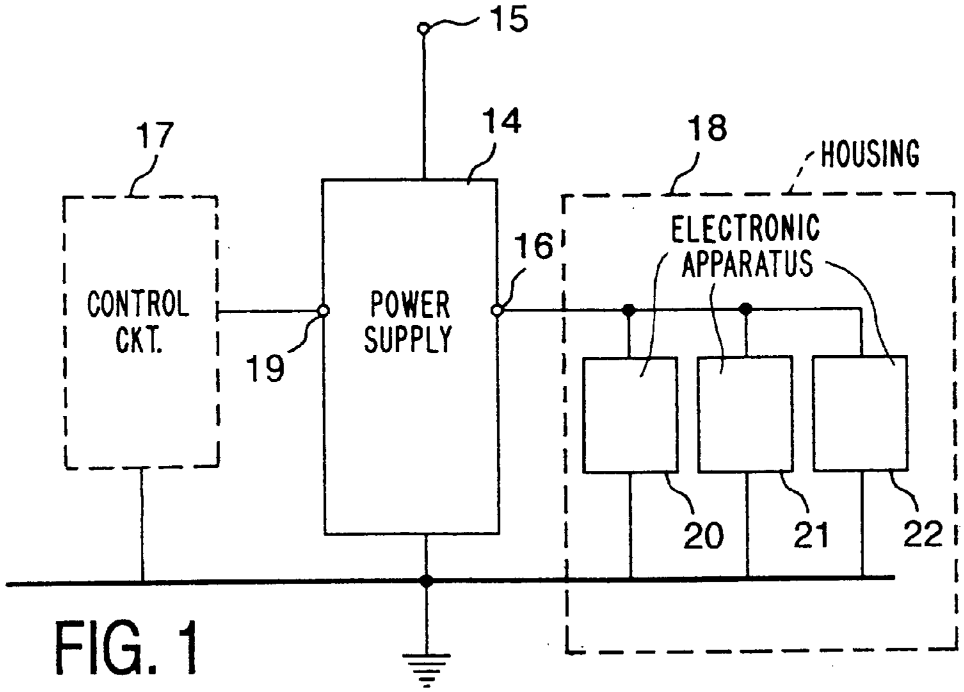
FIG. 1 shows diagrammatically a unit comprising electronic apparatus incorporated in a housing, with a variable voltage generator 17.

The system shown in FIG. 1 comprises:

- a power supply 14 which supplies a controllable voltage at 16 by means of a control signal applied to a control input 19,
- electronic apparatus 20, 21, 22 of any type, possibly comprising elements which dissipate the energy and are fed by the power supply 14 via the terminal 16,
- a circuit 17 for generating a control voltage for the power supply 14.

The power supply 14 may be, for example, a known switched-mode power supply, but it will be evident that any power supply whose voltage is controllable is also suitable.

It is assumed that the switched-mode power supply voltage increases when its control signal voltage increases, a particular case being that in which the signal voltage applied at 19 is reproduced at 16. Those skilled in the art will be able to realize such a power supply, which need not be described in detail in this Application.

Figure 2:
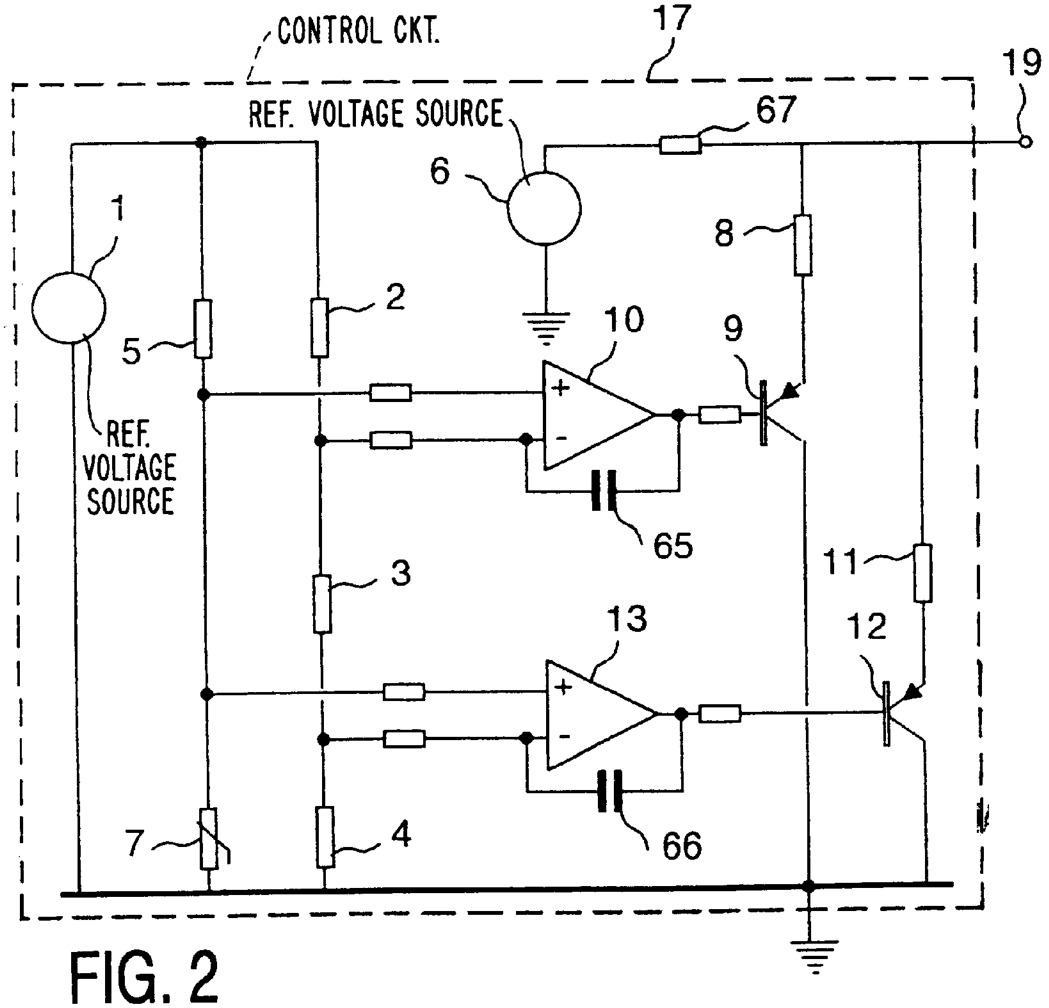
FIG. 2 shows a first variant of the circuit diagram of the variable voltage generator 17 of FIG. 1.

A first variant of the circuit 17 for generating a control signal, shown in FIG. 2, comprises a constant reference voltage source 1 which may be based on the power supply 14 or may alternatively be an independent device. This source feeds a resistance bridge constituted by two branches each consisting of series-arranged resistors, one of the branches being constituted by the series-arranged resistors 2, 3, 4 and the other being constituted by the series-arranged resistors 5 and 7. The voltage across a crossbranch of the bridge between the common point of the resistors 5 and 7 and the common point of the resistors 2 and 3, is applied, each time via a resistor, to inputs + and – of a first differential amplifier 10 having differential inputs, having a moderate gain, and with a capacitive feedback constituted by the capacitance 65 which provides a slow response when the differential input voltage changes sign. The output of the amplifier 10 controls, via a resistor, the base of a transistor 9 arranged in an emitter-follower configuration, whose emitter is connected to a second reference voltage source 6 via a load resistor constituted by two series-arranged resistors 8 and 67. The voltage of this reference voltage source is below that of the first reference voltage source 1.

Another voltage is taken from another crossbranch of the bridge, between the common point of the resistors 5 and 7 and the common point of the resistors 3 and 4 and, is applied, each time via a resistor, to inputs + and – of a second amplifier 13 having differential inputs and arranged in the same way as the first differential amplifier, i.e. with a moderate gain, and with a capacitive feedback constituted by the capacitance 66. The output of the amplifier 13 controls, via a resistor, the base of a transistor 12 arranged in an emitter-follower configuration, whose emitter is connected to the reference voltage source 6 via a load resistor constituted by two series-arranged resistors 11 and 67. The resistor 67 is thus common with the loads of the two transistors 9 and 12. The common point of the resistor 67 and the resistors 8 and 11 constitutes the output 19 of the control signal generating circuit which controls the power supply 14.

The resistor 7 has a negative temperature coefficient. The ratios in the bridges comprising resistors 5, 7 and 2, 3, 4 are such that, when the temperature is normal, i.e. when it is lower than a predetermined threshold, the voltage at the output of the two amplifiers is high, the transistors 9 and 12 are turned off, and the voltage applied to the connection 19 is then the voltage of the second reference voltage source 6. When the temperature increases, the resistor 7 decreases in value and the voltage at the common point of the resistors 5 and 7 decreases. When the temperature reaches a first threshold, for example of 85° C., the voltage at the common point of the resistors 5 and 7 will become less than the voltage at the common point of the resistors 2 and 3, the amplifier 10 is triggered and the transistor 9 is turned on, thereby lowering the voltage at the point 19 by a predetermined amount. When the temperature increases again, reaching, for example 90° C., the voltage at the common point of the resistors 5 and 7 reaches a value which is equal to the voltage at the common point of the resistors 3 and 4, the amplifier 13 is triggered in its turn and the transistor 12 is turned on, thereby lowering the voltage at the point 19 by a supplementary amount.

Figure 4:
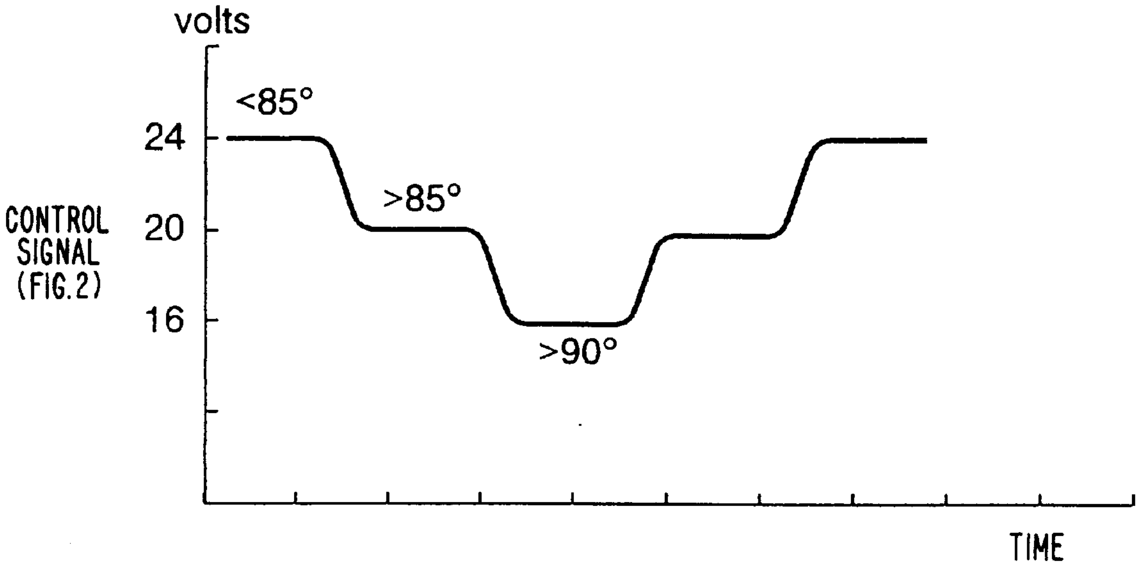
FIGS. 4 and 5 are diagrams showing how the produced voltage varies with temperature and as a function of time, in the case of the variants of the circuit diagram shown in FIGS. 2 and 3, respectively.

The control signal voltage at 19 is illustrated in FIG. 4. It is supposed that the ambient temperature changes with time, plotted on the abscissa so that it, increases and then decreases again. At a normal temperature, i.e. less than 85° C., the voltage remains stable, for example at 24 volts. When the temperature exceeds 85° C., the voltage decreases to, for example 20 volts. Thanks to the capacitance 65 (FIG. 2) the decrease from 24 to 20 volts does not take place suddenly. When the temperature exceeds 90° C., the voltage decreases again to, for example 16 volts. Thanks to the capacitance 66 (FIG. 2), the decrease from 20 to 16 volts does not take place suddenly. If the temperature becomes more favorable again, the voltage inversely increases again from 20 volts to 24 volts.

Figure 3:
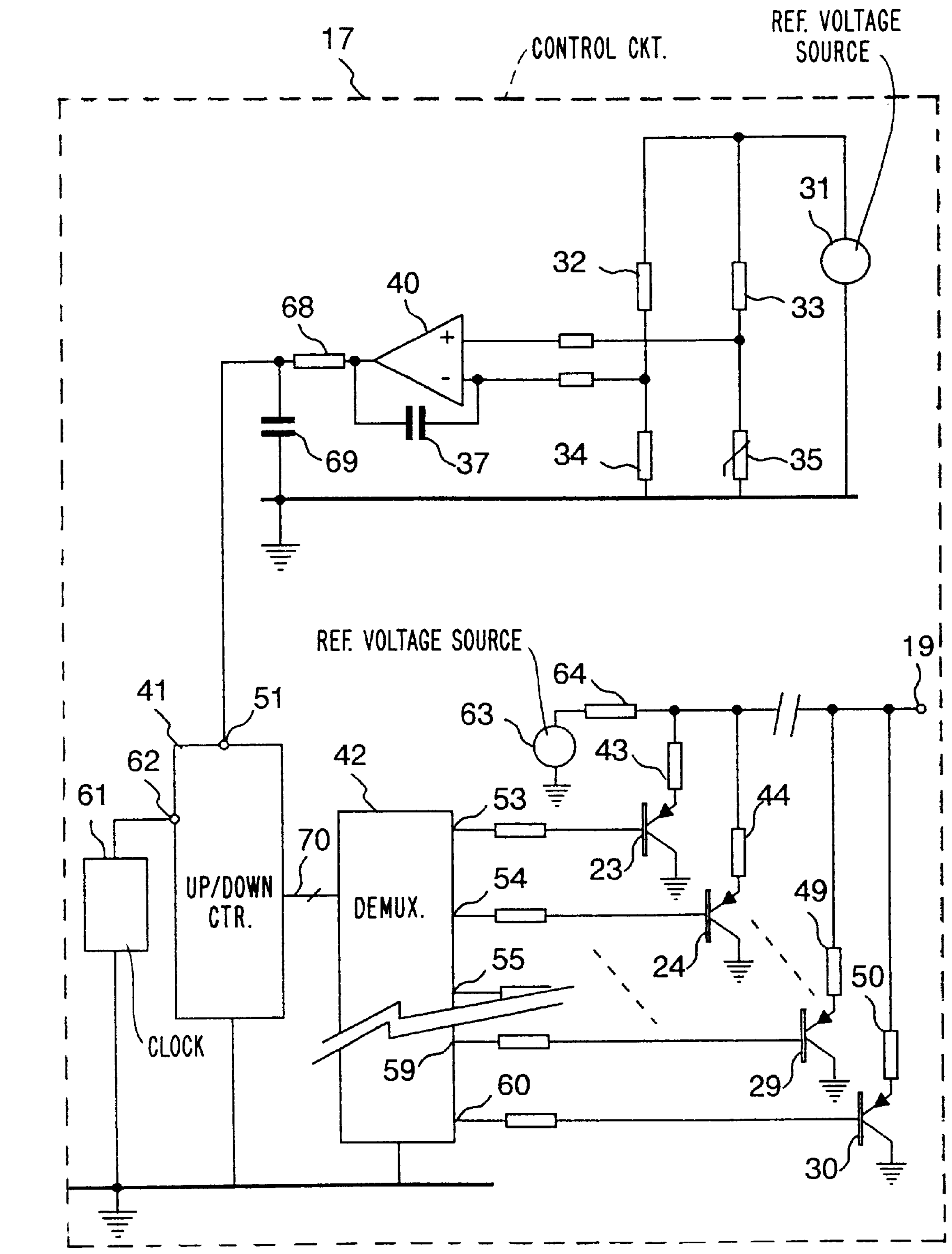
FIG. 3 shows a second variant of the circuit diagram of the variable voltage generator 17 of FIG. 1.

A second variant of the circuit 17 for generating a control signal voltage, shown in FIG. 3, comprises a constant reference voltage source 31 which may be based on the power supply 14 or may alternatively be an independent device. This source feeds a resistance bridge constituted by two branches each consisting of two series-arranged resistors, one of the branches being constituted by the resistors 32 and 34 and the other branch being constituted by the resistors 33 and 35. The voltage taken between the common point of the resistors 33 and 35 and the common point of the resistors 32 and 34 is applied, each time via a resistor, to the differential inputs – and + of a differential amplifier 40 arranged with a moderate gain, and with a capacitive feedback constituted by the capacitance 37, which provides a slow response to a change of sign of the differential input voltage.

The circuit 17 also comprises a clock 61 connected to a terminal 62 of an up/downcounter module 41 whose output 70 with several conductors is connected to an element 42 of the demultiplexer type. The up/down counter module 41, which may be made of commercially available elements, is to provide a number, expressed in numerical form, at the output 70 with several conductors, for example three conductors, so as to be able to count from zero to eight, i.e. $2^3$. The number in question increases or decreases by one unit at each cycle of the clock 61 in accordance with the voltage applied to an input 51 for controlling the counting direction. The output voltage of the amplifier 40 is applied to the input 51 for controlling the counting direction via an integrated resistance-capacitance circuit 68, 69. The up/downcounter 41 comprises means causing the number which it produces to stop at the value of zero when it reaches the end of its downcounting capacity, or to stop at the value of eight when it reaches the end of its upcounting capacity (in contrast to certain counters which form a loop in such a case, i.e. they go to the other end of their counting range so as to continue upcounting or downcounting). The input of the element 42 of the demultiplexer type receives the number created at the output 70 of the module 41 and generates logic signals (high or low) at eight outputs 53–60 in a thermometer scale mode, i.e. for a number having the value 1 at the output 70, the single output 53 is high, for a number having the value 2 at the output 70, the outputs 53 and 54 are high, for a number having the value 3, the outputs 53, 54, 55 are high, and so forth. Each output 53–60 is connected via a resistor to the base of a transistor 23–30, respectively, arranged in an emitter-follower configuration, whose emitter is connected to a reference voltage source 63 via a load resistor constituted by two series-arranged resistors 64 and 43–50, respectively. The resistor 64 is thus common with the loads of the eight transistors 23–30, and all the resistors 43–50 are substantially equal. The common point of the resistor 64 and the resistors 43–50 constitutes the output 19 of the control signal generating circuit which controls the power supply 14.

Figure 5:
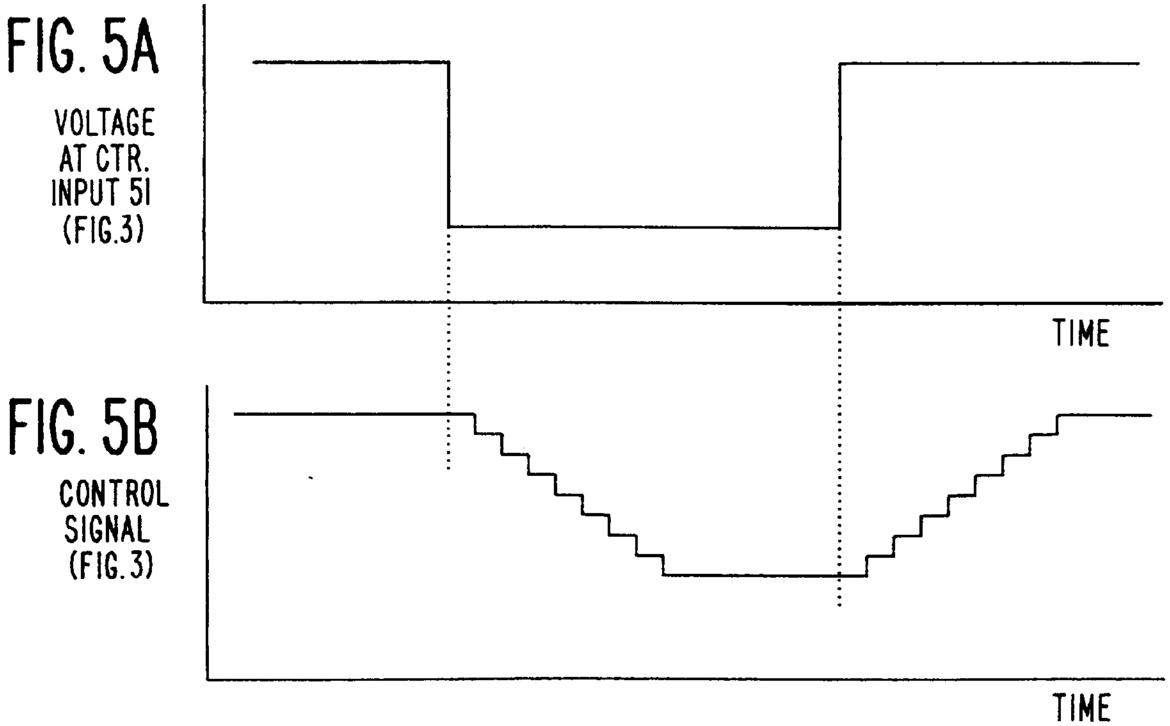

When the temperature is normal, the output of the amplifier 40 has a high value and the module 41 counts up. Of course, it stabilizes at the high end. The output 70 bears the number eight and all the outputs 53–60 are in the high state: the eight transistors 23–30 are all turned off and the voltage at 19 is maximal. When a nominal elevated temperature is reached, for example 85° C., resistor 35 decreases and so the output of the amplifier 40 changes to the low state and the module 41 counts down. The clock 61 has a period of, for example, one minute. Every minute, when the module 41 receiving a clock pulse starts counting down by one unit, the output 70 will successively have the number seven, the number six, etc. while the outputs 53–60 will go one by one to the low state, and the current will flow in one of the resistors 43–50, then in two, then in three, etc., thereby lowering the voltage at the output 19 step by step. FIG. 5 illustrates the shape of the voltage obtained with respect to time. The voltage at the output of the amplifier 40 is shown at A, and the voltage at the output 19 is shown at B. As in FIG. 4, it is supposed that the ambient temperature changes with time, plotted on the abscissa so that it, increases and then decreases. The result is that the voltage at the output of the amplifier 40 returns to the high state after a certain time, and the voltage at the output 19 then increases step by step. The arrangement thus realizes a very long time constant for the voltage variations at the output 19.

It will be evident that several variations may easily be conceived by those skilled in the art. For example a counting capacitance which is different from eight and a different number of conductors 70, outputs 53–60, transistors 23–30 other than eight may alternatively be chosen. Likewise, the demultiplexer element 42 may be dispensed with by connecting the transistors 23–30 directly to the conductors of the output 70, with the resistors 43–50 then having values providing different weights, such that the current supplied in one of the resistors 43–50, when one of the transistors 23–30 is turned on, represents the power of two corresponding to the conductor to which the transistor 23–30 is connected: here 1, 2 or 4. The transistors and the resistors are then three in number ($2^3$=8) in the case of eight steps on the scale for the voltage shown in FIG. 5B.

All the apparatus 20–22 are incorporated in the same housing 18. However, it will be evident that this is not obligatory. The elements 20–22 may alternatively be incorporated in separate housings or, in contrast, all the elements incorporated in the separate housings 17 and 18 may be placed in one and the same housing. Similarly, the power supply 14 may be incorporated in one of the housings 17 or 18.

A known constant power supply source (not shown) may be provided to ensure certain functions for which the decrease of the power supply voltage would involve a service interruption. For example, all the power elements may be fed by the power temperature-controlled supply, while the circuits which do not dissipate much power are fed by a fixed power supply.

What is claimed is:

1. A method of limiting the power dissipation of a unit comprising at least one electronic apparatus included in a housing and a power supply for providing a supply voltage to said apparatus, said supply voltage being controllable by a control signal applied to the power supply; said method comprising:

generating said control signal on the basis of variation of a temperature sensitive parameter provided by a temperature gauge included in said housing, and in such a way that said control signal (i) maintains the supply voltage substantially constant as long as the temperature within the housing remains at or below a predetermined temperature threshold, and (ii) changes the supply voltage by a predetermined amount in at least one incremental step when the temperature within the housing reaches said threshold.

2. A method as claimed in claim 1, wherein there are at least two temperature thresholds, each corresponding to a different predetermined change of the power supply voltage.

3. A method as claimed in claim 1, wherein a change in the power supply voltage is generated in successive incremental steps in synchronism with a clock, each step producing an increase or a decrease of the supply voltage dependent on whether said temperature threshold is exceeded or is not exceeded.

4. A unit comprising (i) at least one electronic apparatus included in a housing, (ii) a power supply for providing a supply voltage to said apparatus, the supply voltage being controllable by a control signal applied to the power supply, and (iii) a control circuit for generating said control signal, said circuit including a temperature gauge having a temperature sensitive parameter; characterized in that said control circuit generates said control signal on the basis of variation of said parameter of the temperature gauge, and in such a way that (a) the supply voltage is maintained substantially constant as long as the temperature within the housing remains at or below a predetermined temperature threshold, and (b) the supply voltage is changed by a predetermined amount in at least one incremental step when the temperature within the housing reaches said threshold.

5. A unit as claimed in claim 4, wherein there are at least two temperature thresholds, each corresponding to a different predetermined change of the power supply voltage.

6. A unit as claimed in claim 5, wherein said control circuit comprises:

two differential amplifiers which are respectively triggered when the temperature in said housing reaches respective ones of said temperature thresholds; and a bridge formed by resistors one of which is dependent on temperature and constitutes said temperature gauge, said bridge having two branches which are fed by a reference voltage.

7. A unit as claimed in claim 4, wherein said control circuit comprises:

a bridge formed by resistors one of which is dependent on temperature and constitutes said temperature gauge, said bridge having two crossbranches a first of which is fed by a reference voltage;

a differential amplifier having inputs connected across a second of said crossbranches and which is triggered by said parameter of the temperature gauge when the temperature within said housing reaches said predetermined temperature threshold, said differential amplifier having an output at which it produces a control voltage when triggered; and a digital circuit coupled to the output of said differential amplifier and actuated by said control voltage to generate discrete increments of said control signal for said power supply, each increment being either additive or subtractive dependent on the trigger state of said differential amplifier and being in synchronism with a clock signal supplied to said digital circuit.

* * * * *